United States Patent [19]

Chin

[11] 3,787,736

[45] Jan. 22, 1974

[54] FIELD-EFFECT TRANSISTOR LOGIC CIRCUIT

[75] Inventor: William Benedict Chin, Wappingers Falls, N.Y.

[73] Assignee: International Business Machines Corporation, Armonk, N.Y.

[22] Filed: June 12, 1972

[21] Appl. No.: 261,768

[52] U.S. Cl. .................................. 307/205, 307/251
[51] Int. Cl. .......................................... H03k 19/08
[58] Field of Search ............ 307/205, 251, 279, 304

[56] References Cited

UNITED STATES PATENTS 3,675,043 7/1972 Bell.................................... 307/205
3,699,539 10/1972 Spence.............................. 307/205

*Primary Examiner*—John W. Huckert
*Assistant Examiner*—Ro E. Hart
*Attorney, Agent, or Firm*—Kenneth R. Stevens

[57] ABSTRACT

A field-effect transistor logic circuit comprising a plurality of interconnected field-effect transistor devices connected between input and output terminals. A positive feedback path connected between the output terminals and a field-effect transistor device connected to the output terminal is operative to provide an output voltage, $V_O$, which is greater than the supply voltage $V_S$ applied to the output device less the threshold voltage $V_{TH}$ of the device, i.e., $V_O > V_S - V_{TH}$.

2 Claims, 2 Drawing Figures

FIELD-EFFECT TRANSISTOR LOGIC CIRCUIT

BACKGROUND OF THE INVENTION

This invention relates to a logic circuit and more particularly to a field effect transistor logic circuit for implementation in monolithic circuit form.

In the past, field effect transistor devices have been generally limited to delivering an output voltage equal to the supply voltage connected to the device less the voltage threshold of the field-effect transistor device itself, that is, $V_O = V_S - V_{TH}$.

This basic characteristic of FET devices creates problems and certain disadvantages when implemented in monolithic form. Firstly, it is necessary to provide a larger value of supply voltage to obtain a minimum output voltage due to the threshold voltage drop of the field effect transistor device. In monolithic form, this causes increased power dissipation over the entire monolithic circuit.

Further, in the monolithic implementation of most field effect transistor devices, it is necessary to distribute a metallized power line over a silicon dioxide layer separating the metallized line and the active areas of the semiconductor substrate. Consequently, if a sufficiently high voltage is applied to the metallized lines, parasitic field effect transistor devices are created. As a result, unintended conductive paths are formed on the monolithic substrate so as to render the overall structure inoperative. Specifically, it has been found that on monolithic substrates carrying P channel type field effect transistors, a voltage level higher than 11 volts tends to create parasitic field effect transistors for a given $SiO_2$ layer thickness. These same P channel field effect transistors possess a voltage threshold drop of approximately 2 volts. Accordingly, if the design requirements of the circuit necessitates an output driving voltage in the 8.5 volts or greater range, a supply voltage of greater than 11 volts is required, and thus tend to create parasitic field effect transistors.

SUMMARY OF THE INVENTION

It is therefore an object of the present invention to provide a field effect transistor (FET) logic circuit which requires a lower supply voltage than normally is necessary to generate a given output voltage.

Another object of the present invention is to provide a field effect transistor logic circuit which operates on a supply voltage of a sufficiently low value so as to avoid the creation of parasitic field effect transistors.

Another object of the present invention is to provide a field effect transistor true-complement generator which when implemented in monolithic form requires a reduced number of input pads when employed in certain applications, namely, in combination with decoder-type circuits.

In accordance with the aforementioned objects, the present invention provides a field effect transistor logic circuit comprising a positive feedback network between the output terminal and a field effect transistor device connected to the output terminal. Further, the field effect transistor true complement generator circuit contains an inhibit section means which allows the circuit to share a common input pad with other similar true complement generators when implemented in monolithic form.

The foregoing and other objects, features and advantages of the invention will be apparent from the following more particular description of the preferred embodiment of the invention as illustrated in the accompanying drawings.

DESCRIPTION OF THE PREFERRED EMBODIMENT

Figure 1:
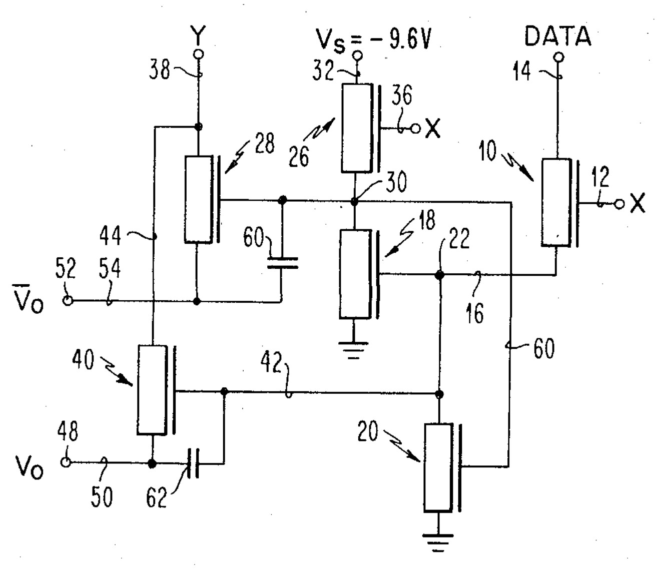
FIG. 1 is an electrical schematic illustrating the true-complement generator of the present invention.
Figure 2:
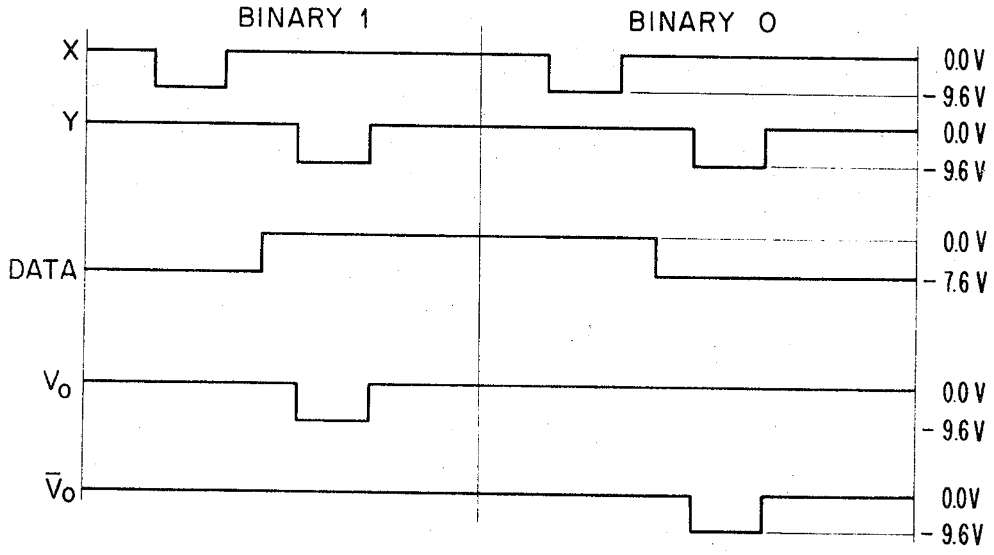
FIG. 2 is a voltage-time plot illustrating the mode of operation for the circuit shown in FIG. 1.

An input FET device 10 is adapted to receive an X gating signal at its gate terminal via line 12 and a data signal to its drain terminal via line 14. Line 16 connects the source terminal of FET device 10 to a pair of FET devices 18 and 20. Line 16 connects to the gate terminal of device 18 and to the drain terminal of device 20 at a mode schematically indicated at 22. The source terminals of both devices 18 and 20 are connected to ground potential in the preferred embodiment.

The drain terminal of device 18 connects to another pair of FET devices 26 and 28 via node 30. Node 30 connects to the source of device 26 and to the gate terminal of device 28.

The drain terminal of device 26 is adapted to receive a supply voltage $V_S$ via line 32. The value of $V_S$ is illustrated as −9.6 volts; however, the voltage values given in the preferred embodiment are merely illustrative and are in no way intended to limit the present invention. The X gating signal is also applied to the gate terminal of device 26 via line 36. The drain terminal of device 28 is adapted to receive a Y gating signal via line 38.

The drain terminal of device 20 is connected to the gate terminal of another output FET device 40 by way of line 42. The pair of output devices 28 and 40 are interconnected at their respective drain terminals by means of line 44.

A true binary signal is generated on output terminal 48 and is connected to the source terminal of device 40 via line 50. Similarly, a complementary binary signal is generated on output terminal 52, which in turn is connected to the source terminal of output device 28 via line 54. A pair of capacitors 60 and 62 are connected across the gate and source terminals of output devices 28 and 40, respectively. The capacitors 60 and 62 provide a positive feedback path from their respective source terminals, to their gate terminals.

The preferred embodiment only discloses the electrical schematic for the true complement generator. However, its monolithic implementation is readily obtainable using well known integrated circuit techniques. The illustrative voltage values and voltage threshold levels are given for a P channel type FET device, but the invention is equally implementable with N channel type field effect transistor devices as well.

The illustrated true complement generator is capable of furnishing true and complement output signals having a value equal to the supply voltage and which can be monolithically implemented with a minimum number of components, vis-a-vis other presently known FET true complement generators.

OPERATION

The operation of the circuit initially is illustrated for the application of a binary 1 to the data line 14. For the P type channel FET device illustrated and the given voltage values employed, a binary 1 is represented by a relatively negative voltage level, sepcifically, −7.6 volts.

Initially, the gate terminals of devices 10 and 26 receive a negative voltage of −9.6 volts and are turned on to a conductive state. Conduction of device 10 which charges the node 22 to a level approximately equal to −7.6 volts causes device 18 also to turn on and be placed in a conductive state. Node 30 is charged to a potential which is approximately equal to −9.6 volts times the transconductance ratios of the devices 18 and 26.

Next, the X signal returns to 0.0 volts and thus, devices 10 and 26 turn off. As a result, the voltage at node 30 is discharged to ground potential through the conductive device 18. The ground potential is transmitted from node 30 to the gate of device 20 via line 60 and thus insures that device 20 remains off at this time.

Next, the Y signal applied to line 38 goes to approximately −9.6 volts, and as a result, device 40 is turned on and device 28 is non-conductive or off.

Normally, the output terminal 48 would rise to an output voltage equal to the value of the Y signal less the threshold drop of device 40, or in this particular example, approximately −7.6 volts. However, the positive feedback path provided by capacitor 62 charges node 22 to a voltage value at least greater than the threshold voltage ($V_{TH}$) drop of the device 40. In this manner, the output voltage $V_O$ on line 48 is capable of rising to a level equal to the value of its driving voltage, or in this case, the Y signal equal to −9.6 volts. The positive feedback to node 22 also functions to turn device 18 further on or into a higher state of conduction so as to insure that node 30 is held at ground potential, which in turn is transmitted to output terminal 52 as a complementary output signal $\overline{V_O}$.

In a similar manner, a binary 1 is generated on output terminal 52 and a binary 0 on output terminal 48 upon the application of a binary 0 to input terminal 14. With the data line 14 at 0.0 volts, representative of a binary 0, and the X signals to the gate terminals of devices 10 and 26 at a negative level, devices 10 and 26 are conductive. Node 30 rises to a value of $V_S$ minus the threshold voltage of device 26 or approximately −7.6 volts, and as a result turns device 20 to a conductive or on state. Conversely, node 22 is at ground potential by virtue of the 0.0 volt signal being applied to line 44.

When the X gating signal returns to 0.0 volts, device 26 turns off; however, device 20 remains conductive due to the voltage applied to its gate terminal via line 60 from node 30.

Next, the Y gating signal is lowered to −9.6 volts so as to turn device 28 to an on or conductive state. As previously described with respect to the generation of an output signal on terminal 48, output terminal 52 is driven to a level of approximately −9.6 volts by virtue of the positive feedback path provided by capacitor 60 for charging node 30. Similarly, device 20 is further driven into conduction so as to insure that node 22, and consequently, output terminal 48 is maintained at ground potential. In this manner, the application of a binary 0 to the data line 14 generates a true binary signal on output terminal 48 and the complement on output terminal 52.

Although the invention has been particularly shown and described with reference to the preferred embodiments thereof, it will be understood by those skilled in the art that the foregoing and other changes in form and details may be made therein without departing from the spirit and scope of the invention.

What is claimed is:

1. A true-complement signal generator field-effect-transistor (FET) logic circuit operative with a two phase gating signal comprising:

a. an FET data input device (10) having a gate terminal for receiving a first gating signal and a second terminal for receiving a data signal, b. a three device FET data buffer storage circuit connected to said FET data input device and including first and second directly cross coupled FET devices (18 and 20, respectively), and a third FET buffer gating device (26) connected to said first and second directly cross coupled FET devices, c. said third FET buffer gating device having a gate terminal for also receiving first gating signal, d. said FET data input device and said third FET buffer gating device being simultaneously responsive to said first gating signal in conjunction with the application of said data signal to said FET signal data input device for selectively storing binary information in said first and second directly cross-coupled FET devices, e. a data driver circuit including fourth and fifth FET devices (28 and 40, respectively) having respective gate terminals connected to first and second nodes (30 and 22, respectively) constituting a portion of said first and second directly cross-coupled FET devices, f. each of said fourth and fifth FET devices having respective other terminals for simultaneously receiving a second gating signal, g. first and second output terminals each separately connected to said first and second nodes, and h. said fourth and fifth FET devices being selectively responsive to said second gating signal and said binary information stored in said first and second directly cross-coupled FET devices for generating true and complement signals at said first and second output terminals.

2. A true-complement signal generator field-effect-transistor (FET) logic circuit operative with a two phase gating signal as in claim 1 further including:

a. first and second positive feedback paths, each respectively connected between one of said output terminals and a respective one of said gate terminals associated with said fourth and fifth FET devices, b. each of said first and second positive feedback paths including a capacitor.

* * * * *